US007015467B2

(12) United States Patent
Maldonado et al.

(10) Patent No.: US 7,015,467 B2
(45) Date of Patent: Mar. 21, 2006

(54) GENERATING ELECTRONS WITH AN ACTIVATED PHOTOCATHODE

(75) Inventors: Juan Ramon Maldonado, Palo Alto, CA (US); Steven T. Coyle, Alameda, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 10/697,715

(22) Filed: Oct. 29, 2003

(65) Prior Publication Data

US 2004/0140432 A1 Jul. 22, 2004

Related U.S. Application Data

(63) Continuation-in-part of application No. 10/282,324, filed on Oct. 10, 2002.

(51) Int. Cl.
*G01N 23/00* (2006.01)
*G21K 7/00* (2006.01)

(52) U.S. Cl. .................. 250/306; 250/423 P; 250/307; 250/310; 250/311

(58) Field of Classification Search .................. 428/690; 430/139; 250/306, 307, 310, 311, 337, 484.4, 250/423 P
See application file for complete search history.

(56) References Cited

U.S. PATENT DOCUMENTS

| 3,631,303 | A | 12/1971 | Antypas et al. |
|---|---|---|---|
| 3,632,442 | A | 1/1972 | Turnbull et al. |
| 3,814,993 | A | 6/1974 | Kennedy |
| 3,884,539 | A | 5/1975 | Sommer |
| 3,895,234 | A | 7/1975 | O'Keefe et al. |
| 3,914,136 | A | 10/1975 | Kressel |
| 4,193,089 | A | 3/1980 | Brougham et al. |
| 4,287,230 | A | 9/1981 | Galves et al. |
| 4,311,939 | A | 1/1982 | Faulkner et al. |
| 4,390,789 | A | 6/1983 | Smith et al. |
| 4,398,118 | A | 8/1983 | Galves et al. |
| 4,460,831 | A | 7/1984 | Oettinger et al. |

(Continued)

FOREIGN PATENT DOCUMENTS

WO   PCT/US98/50934   11/1998

OTHER PUBLICATIONS

Martin, et al. "Relative Quantum Efficiency Measurement of CsI, CsBr, and CsI/CsBr Coated Micro Channel Plates," Smithsonian Ctr for Astrophysics, Cambridge MA 02138.
Dinh et al., "Synthesis and characterization of Si/Cs/O nanocluster thin films with negative ion affinity" American Physical Society, 1999.
Kong et al. "Cesium telluride photocathodes," American Institute of Physics, 1995.

*Primary Examiner*—Nikita Wells
*Assistant Examiner*—Mary El-Shammaa
(74) *Attorney, Agent, or Firm*—Janah & Associates

(57) ABSTRACT

An electron beam apparatus comprises a beam source to generate a radiation beam that is directed onto a photocathode to generate an electron beam. The photocathode comprises an electron-emitting material composed of activated alkali halide, such as for example, cesium bromide or cesium iodide. The activated alkali halide has a lower minimum electron emission energy level than the same material in the un-activated state, and provides efficient photoyields when exposed to radiation having an energy level that is higher than the minimum electron emission energy level. The emitted electrons can be collimated into beams and used to write on, inspect, or irradiate a workpiece.

30 Claims, 10 Drawing Sheets

U.S. PATENT DOCUMENTS

| | | | |
|---|---|---|---|
| 4,608,332 A | 8/1986 | Ward | |
| 4,616,248 A | 10/1986 | Khan et al. | |
| 4,652,762 A | 3/1987 | Ward | |
| 4,694,178 A | 9/1987 | Harte | |
| 4,725,724 A | 2/1988 | van der Velden | |
| 4,769,549 A * | 9/1988 | Tsuchino et al. | 250/484.4 |
| 4,820,927 A | 4/1989 | Langner et al. | |
| 4,914,136 A | 4/1990 | Drent et al. | |
| 4,963,751 A * | 10/1990 | Kano et al. | 250/484.4 |
| 4,970,392 A | 11/1990 | Oettinger et al. | |
| 5,028,509 A * | 7/1991 | Shimada et al. | 430/139 |
| 5,042,058 A | 8/1991 | Rentzepis | |
| 5,270,643 A | 12/1993 | Richardson et al. | |
| 5,340,661 A * | 8/1994 | Van Havenbergh et al. | 428/690 |
| 5,395,738 A | 3/1995 | Brandes et al. | |
| 5,426,686 A | 6/1995 | Rentzepis et al. | |
| 5,430,292 A | 7/1995 | Honjo et al. | |
| 4,554,458 A | 11/1995 | Behringer et al. | |
| 5,466,541 A * | 11/1995 | Van Havenbergh et al. | 428/690 |
| 5,606,163 A * | 2/1997 | Huston et al. | 250/337 |
| 5,623,182 A | 4/1997 | Okano et al. | |
| 5,930,331 A | 7/1999 | Rentzepis et al. | |
| 5,982,094 A | 11/1999 | Niigaki et al. | |
| 5,986,263 A | 11/1999 | Hiroi et al. | |
| 6,172,365 B1 | 1/2001 | Hiroi et al. | |
| 6,184,526 B1 | 2/2001 | Kohama et al. | |
| 6,259,094 B1 | 7/2001 | Nagai et al. | |
| 6,265,719 B1 | 7/2001 | Yamazaki et al. | |
| 6,303,918 B1 | 10/2001 | Estrera et al. | |
| 6,476,401 B1 | 11/2002 | Veneklasen et al. | |
| 6,531,816 B1 | 3/2003 | Breskin et al. | |
| 2002/0015143 A1 | 2/2002 | Yin et al. | |
| 2002/0028399 A1 | 3/2002 | Nakasuji et al. | |
| 2002/0088940 A1 | 7/2002 | Watanabe et al. | |
| 2002/0100872 A1 | 8/2002 | Hiroi et al. | |
| 2003/0042434 A1 | 3/2003 | Mankos et al. | |
| 2003/0048427 A1 | 3/2003 | Fernandez et al. | |
| 2003/0066963 A1 | 4/2003 | Parker et al. | |
| 2003/0085355 A1 | 5/2003 | Kohama | |

* cited by examiner

GENERATING ELECTRONS WITH AN ACTIVATED PHOTOCATHODE

CROSS REFERENCE

This application is a continuation-in-part of U.S. patent application Ser. No. 10/282,324, filed on Oct. 10th, 2002, entitled "ELECTRON BEAM PATTERN GENERATOR WITH PHOTOCATHODE COMPRISING LOW WORK FUNCTION CESIUM HALIDE", by Maldonado et al., which is incorporated herein by reference in its entirety.

GOVERNMENT SUPPORT

At least a portion of the work related to the invention described herein was performed with Government support under Contract Number N581-99C-8624. The Government has certain rights in these portions of the invention.

BACKGROUND

Embodiments of the present invention relate to the generation of electron beams and their applications.

Electron beams are used in a number of different applications. For example, electron beams can be modulated and directed onto an electron sensitive resist on a workpiece, such as a semiconductor wafer or mask, to generate an electron beam pattern on the workpiece. Electron beams can also be used to inspect a workpiece by, for example, detecting electrons emerging or reflected from the workpiece, to detect defects, anomalies or undesirable objects. Electron beams can also be used to irradiate a workpiece, such as a postal envelope, to destroy toxic chemicals or harmful microorganisms therein.

A typical electron beam apparatus comprises an electron beam column that includes an electron beam source to generate one or more electron beams and electron beam elements to focus or deflect the electron beams across a workpiece, which is held on a movable support. The electron beam source typically comprises a photocathode and wavelength matched radiation beam source. The photocathode can be a radiation transparent workpiece coated with an electron-emitting material. The electron-emitting material has an electron work function, which is the minimum electron emission energy level required to emit an electron from the surface of the material. A beam source directs radiation onto the backside of the transparent workpiece, the radiation having an energy level that is at least as high as the electron work function. When photons of the beam impinge on the electron-emitting material they excite electrons to a suitable energy level that emits the electrons from the electron-emitting material. For example, one photocathode-laser combination comprises an argon-ion laser, a frequency multiplier crystal, and a photocathode comprising a electron-emitting material of Mg or MgO. The argon-ion laser has a fundamental wavelength of 514 nm, which is reduced to 257 nm by the frequency multiplier crystal, to generate a laser beam having an energy level of about 4.8 eV. The frequency multiplied 4.8 eV laser beam has a higher energy than the workfunction of the Mg or MgO electron-emitting material, which is 3 to 4 eV, thus, the laser system and the electron-emitting material are suitably matched.

Electron-emitting materials used in such conventional photocathode systems have several limitations. For example, electron-emitting magnesium gradually oxidizes from exposure to residual oxygen in a low-pressure environment. MgO emitters often gives rise to deleterious blanking effects when the incident laser beam is blanked, i.e., turned on after an off period, when modulating the electron beams. In another example, the emission spot of a CsTe electron-emitting material often grows in size in operation, requiring the electron-emitting material to be patterned or covered with a protective anti-oxidation layer of CsBr, as described in commonly assigned U.S. patent application publication no. US 2003/0042434A1, which is incorporated herein by reference in its entirety. Cesium antimonide electron-emitting materials also have to be covered with a protective layer of CsBr to minimize attenuation of the quantum efficiency of the electron-emitting over time in an oxygen environment, as described in U.S. Pat. No. 6,531,816 B1, which is also incorporated herein by reference in its entirety.

A further problem with conventional electron beam apparatus arises from their throughput versus resolution trade-off. Conventional apparatus that use a single electron beam to scan across a workpiece provide relatively low throughput when used at high resolutions. For example, at current line width resolutions of 100 to 130 nm, a single electron beam system takes about 6 hours to scan across the entire surface of a 200 mm workpiece; however, at resolutions of 35 to 50 nm, the same system would take about 50 hours to scan the same workpiece. This problem is reduced in multiple electron beam apparatus, which use a plurality of electron beams drawn from one or more electron sources as separate and well-defined beams. The multi-beam systems provide higher throughput and speed even at high resolutions. However, even these multi-beam systems are limited by the degradation, low beam current and electron cross-over limitations of conventional photocathodes.

Thus, it is desirable to have an electron generating system that can generate a consistent stream of electrons without deleterious changes in operation. It is further desirable to have a properly matched photocathode and beam source capable of generating electrons with good efficiency and consistent emissivity. It is also desirable to have a stable photocathode that does not degrade due to oxidation in the vacuum environment. It is further desirable to have an electron beam apparatus capable of providing good throughput at high resolutions.

SUMMARY

An electron beam apparatus comprises a radiation beam source to generate a radiation beam and a photocathode comprising an electron-emitting material composed of activated alkali halide having a minimum electron emission energy level that is less than 75% of the minimum electron emission energy level of the un-activated alkali halide. The electron-emitting material emits electrons when the radiation beam is incident thereon. Electron beam elements are provided to form an electron beam from the emitted electrons and direct the electron beam onto a workpiece. A support is provided to support the workpiece.

In one version, the photocathode comprises an electron-emitting material composed of activated alkali halide having a minimum electron emission energy level that is less than about 5 eV, such that the electron-emitting material emits electrons when a laser beam having a wavelength of from about 190 to about 532 nm is incident thereon.

In another version, an electron beam pattern generator generates a pattern of electrons on a workpiece. The pattern generator comprises the aforementioned photocathode, and a laser beam source to generate the laser beam having a wavelength of from about 190 to about 532 nm. A beam modulator is provided to modulate the intensity of the laser beam according to a pattern and direct the modulated laser beam onto the photocathode. Electron beam elements are used to form an electron beam from the emitted electrons and direct the electron beam onto a workpiece. A support is provided to support the workpiece.

Yet another version comprises an electron beam inspection apparatus that is used to inspect a workpiece with electron beams. The apparatus comprises the aforementioned photocathode and a laser beam source to generate a laser beam having a wavelength of from about 190 to about 532 nm. Electron beam elements are used to form an electron beam from the emitted electrons and direct the electron beam onto a workpiece. A support supports the workpiece. An electron detector is used to detect electrons backscattered from the workpiece to inspect the workpiece.

In an electron generating method, an electron-emitting material composed of alkali halide is provided. The alkali halide is activated to form an activated alkali halide having a minimum electron emission energy level that is less than 75% of the minimum electron emission energy level of the un-activated alkali halide. A first radiation beam is directed on the activated alkali halide, the first radiation beam having photons with an energy level that is higher than the energy level of the activated alkali halide to cause electrons to be emitted therefrom.

A method of manufacturing a photocathode for an electron beam apparatus comprises providing a substratum in a process zone, evacuating the process zone, evaporating an alkali halide in the process zone to deposit alkali halide on the workpiece, and activating the deposited alkali halide to have a minimum electron emission energy level that is less than 50% of the electron emission minimum electron emission energy level of the un-activated alkali halide by directing radiation onto the deposited alkali halide for a sufficient time period to develop an interior region having a first alkali concentration and a surface region having a second alkali concentration. The second alkali concentration results from a capping layer of alkali formed on the surface of the material.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

Figure 1:
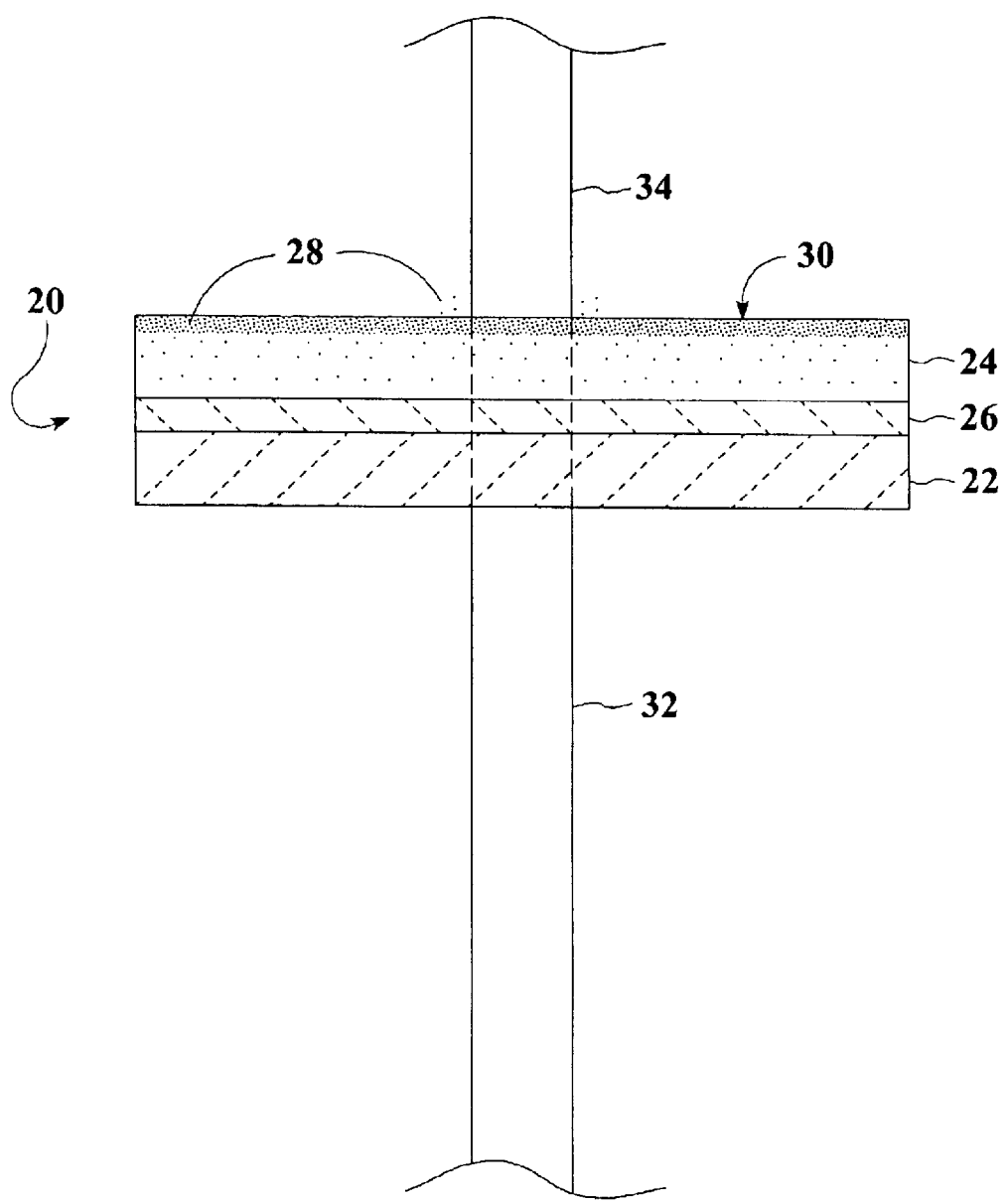
FIG. 1 is a sectional side view of a photocathode comprising an electron-emitting material comprising alkali halide with a concentration gradient of alkali.

Electrons are generated from a photocathode 20 comprising a substratum 22 supporting an electron-emitting material 24, as illustrated in FIG. 1. The photocathode 20 is typically a negatively biased electrode, but may also be at a floating or ground potential. The electron-emitting material 24 absorbs photons that excite electrons above the energy level of a surrounding vacuum environment, and a portion of the electrons that are sufficiently excited are emitted into the vacuum. Thus, the electron-emitting material 24 is a material has a minimum electron emission energy level that is sufficiently low to emit electrons when photons having an energy greater than the minimum electron emission energy level are incident upon and absorbed by the electron-emitting material 24. The substratum 22 typically comprises a radiation permeable material that is permeable to radiation in a predefined band of wavelengths, so that the radiation can pass through the substratum 22 to reach the electron-emitting material 24. For example, the substratum 22 may comprise sapphire. The photocathode 20 can also have a conductive layer 26 between the substratum 22 and the electron-emitting material 24 to provide a good adhesion layer that also serves as an electrode to complete the photocurrent circuit and is substantially transparent to the radiation. If the radiation is impinging from the photocathode side, the conductive layer may be opaque to the incident radiation wavelength. The conductive layer may also include materials with good adhesion and low chemical reactivity with the photocathode like Mo, Cr and Ta. While an illustrative embodiment of the photocathode is described, it should be understood that other embodiments are also possible, such as embodiments in which there is no substratum and the photocathode is made entirely from the electron emitting material, or others which have different shapes or which use different layers, thus, the scope of the claims should not be limited to the illustrative embodiments.

The photocathode 20 comprises an electron-emitting material 24 composed of an activated alkali halide that emits electrons when excited with radiation, the activated alkali halide material having a minimum electron emission energy level that is lower than the minimum electron emission energy level of the un-activated material. The alkali metals, found in Group I of the periodic table (formerly known as group IA), are reactive metals that have only one electron in their outer shell, and can lose that one electron in ionic bonding with other elements. The alkali metals include lithium, sodium, potassium, rubidium, cesium and francium. The halogens of Group VII of the periodic table include chlorine, fluorine, bromine and iodine. The alkali halide material comprises at least one alkali metal and at least one halogen in a ratio that may be a stochiometric or non-stoichiometric ratio.

Of the alkali halides, cesium halide materials have been found to have good results, although the other alkali halides may also be used. The cesium halide material comprises at least one cesium atom and at least one halogen atom. The cesium halide is not necessarily limited to particular stoichiometric formulations of conventional cesium halides, but can include non-stochiometric formulations that provide a desirable minimum electron emission energy level. In addition, the cesium halide material can also contain other materials, beside cesium and halogen.

The alkali halide has to be activated before it can emit electrons at the desired efficiency and yield levels, and to have a lower minimum electron emission energy level than the theoretical minimum electron emission energy of the same but untreated alkali halide material. The activation treatment reduces the minimum electron emission energy level of the alkali halide by at least 75%, and can even lower the energy level by at least 50%. For example, without activation, the theoretically determined energy gap of an exemplary alkali halide such as CsBr is 7.8 eV, however, after activation the minimum emission energy of the same CsBr material can be reduced to less than about 5 eV, for example, about 4.8 eV, and can even be about 3 eV. The significantly lower minimum electron emission energy level makes it practicable to use the electron-emitting material in conventional applications.

In one version of the activation method, the electron-emitting material 24 is activated by irradiating the alkali halide material with a radiation having a sufficiently high energy level and for a sufficiently long time period to create an activated material having a lower minimum electron emission energy level. The radiation may be, for example, UV, X-ray, visible light, or electron beams. During irradiation, it is believed that the reduced minimum electron emission energy level is achieved by the migration of alkali metal atoms to form color centers in the bulk of the alkali halide material and a capping layer on its surface. A color center (or F-center) is a lattice defect in a crystalline solid comprising a vacant negative ion site and an electron bound to the site. Such defects absorb radiation having a wavelength that corresponds to the band gap energy level created by the defect, and can make certain normally transparent crystals appear colored, or can make colored crystals change color. The color centers and their corresponding radiation absorption bands may be caused by one or more of hole center, electron centers, di-vacancy and di-hole centers, and even Frenkel defects. The presence of the color centers can be detected by observing a change in a color of the material, if such a color change is in the observable visible spectrum. Scanning a series of sequentially incremented wavelengths across a specimen of the activated material and detecting the resultant absorption spectrum can be used to detect the color centers. The detected absorption spectrum has absorption peaks corresponding to the wavelengths of the incident radiation that is absorbed by the color centers. Thus, the un-activated alkali halide absorbs a first level of a radiation having a wavelength that falls in the absorption band of color centers to form the activated alkali halide, which then absorbs a second level of the same radiation to emit electrons. Photoelectron spectroscopy can also be used to probe the electronically excited states of alkali-halide material with excess electrons, in which the excess electrons are pumped up to their excited states by one laser pulse before being driven into the continuum by a second laser pulse.

Activation of the alkali halide material is affected during irradiation when the alkali halide material is heated to a temperature of from about 60 to about 300° C. At relatively low temperatures of less than about 100° C., the heat increases the diffusion of alkali metal atoms, such as the cesium, to the surface of the alkali halide film to form a capping surface layer having a higher concentration of alkali-atoms than that present in the bulk of the interior region of the activated material. However, the material can be deactivated when it is heated to a sufficiently high temperature. The higher surface concentration of alkali metal atoms in the surface reduces the effective work function of the alkali halide material by lowering the energy required to excite electrons out of the surface. Typically, directing a laser beam having an output of a few mWatts for a time period of a few hours, such as about 180 minutes (3 hours), on the electron-emitting material is sufficient to generate the surface activated layer.

In the activation process, the incident radiation causes the alkali metal atoms, such as the cesium atoms, to migrate to the surface of the electron-emitting material 24 to form a thin capping layer having a higher concentration of alkali metal than the surrounding bulk material. The capping layer can have a thickness from at least a fraction of a monolayer to several monolayers of atoms. It is believed that the capping surface layer of alkali metal cooperates with the underlying bulk of the alkali halide material to form a dipole that reduces the electron emission energy at the surface of the resultant electron-emitting material 24.

For example, in an electron-emitting material 24 comprising cesium halide, the cesium halide material is deposited as a layer on a substratum and then activated to have a capping layer of cesium atoms 28 on its surface. When photons irradiate the electron-emitting material 24, the emission surface 30 with the higher cesium concentration of the capping layer provides an effectively lowered minimum electron emission energy level at the surface of the material 24 that allows longer-wavelength (lower energy) photons to generate electron emission from the activated material. For example, by deep-UV light activation, the minimum electron emission energy level at the emission surface 30 of a cesium bromide or cesium iodide layer can be reduced to less than 5 eV, such as about 4.8 eV or 3.6 eV or even about 2.1 eV. Then, a photon source such as an argon-ion laser beam 32 with a wavelength of at least about 257 nm, for example, the laser beam 32 can have a wavelength of about 364 or 532 nm can be used to irradiate and cause electron emissions from such an electron-emitting material 24. The photoyield of the 532 nm laser beam is significantly lower than the corresponding one for the smaller-wavelength laser beam, such as the 257 nm laser beam.

In one version, the electron-emitting material 24 comprises activated cesium bromide material. This activated cesium bromide material can yield a quantum efficiency of at least about 0.1% when irradiated with approximately 4.8 eV photons (257 nm), and an energy spread of about 1 eV. This version is advantageous because conventional photoemitters like Au have a much lower efficiency and are susceptible to surfacecontamination.

In another version, the electron-emitting material 24 comprises cesium iodide material. The cesium iodide material is advantageous because it may be more stable in terms of temperature resistance or corrosion resistance.

Figure 8:
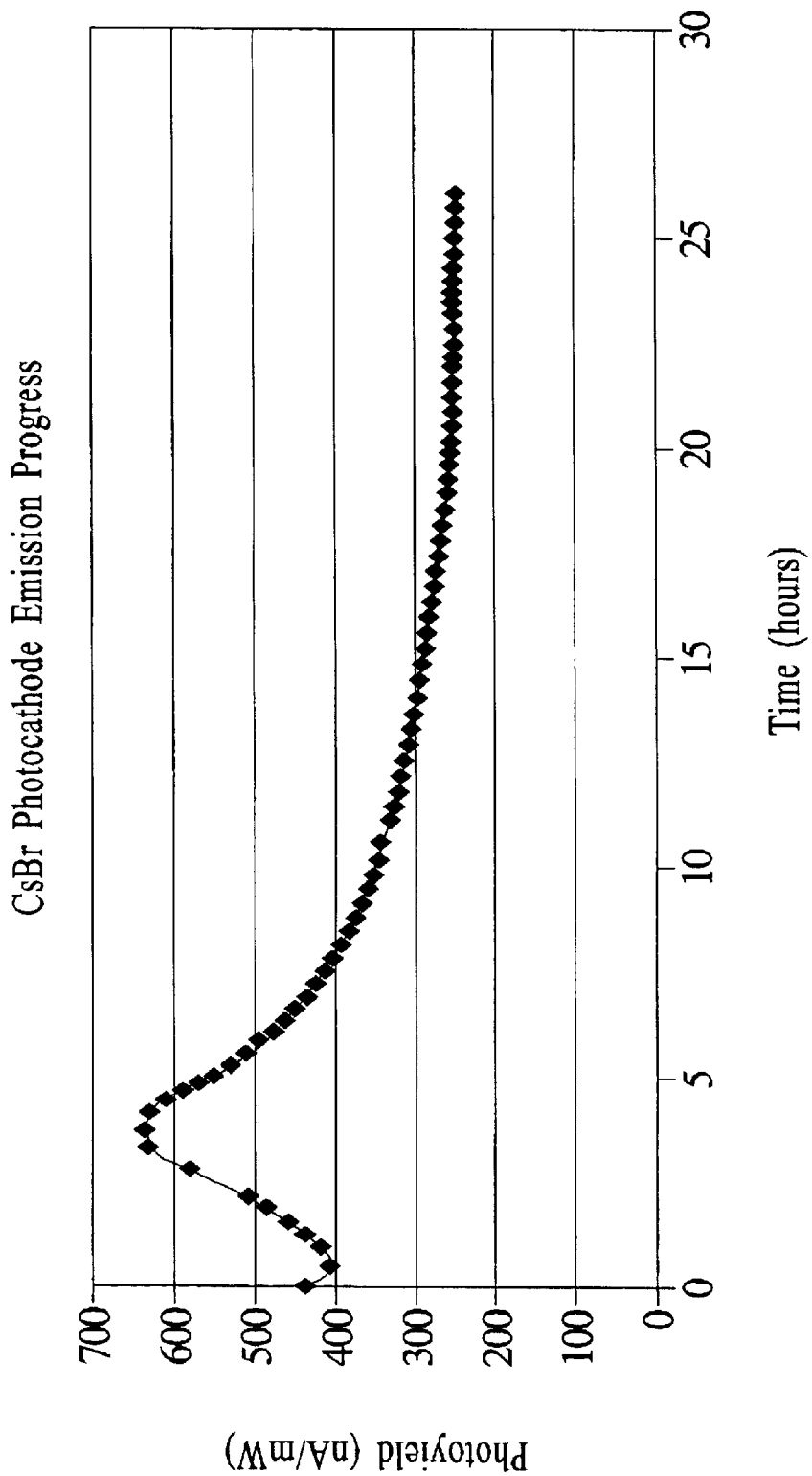
FIG. 8 is a plot of electron emission output over time for a CsBr photocathode illuminated by an argon-ion laser.

The activated alkali halide electron-emitting material also provides good photoyields that exhibit low degradation over time in a vacuum environment. The photoyield is a measure of the electron emitting efficiency of the electron emitter layer. An activated alkali halide, for example, activated CsBr, provides a photoemission electron yield at least about 20 nA/mW, and more typically, even about 200 nA/mW. In contrast, the same un-activated CsBr photocathode generally provides no yields or yields of less than about 2 nA/mW. This demonstrates an improvement in yield of a factor of 10 to about 100 times. Furthermore, unlike conventional photocathode materials, the electron yield reduces only marginally after operation for extended periods in vacuum environments. For example, a photocathode having an activated CsBr electron-emitting material with an argon ion laser can provide a photoyield of greater than 200 nA/mW that remains stable at these levels in a vacuum environment for an extended time period, as shown in FIG. 8. The output was found to remain stable for more than 150 hours without appreciable degradation.

The lower minimum electron emission energy level of the activated material also allows use of activated beam sources that are well characterized and commonly used systems, such as an argon ion laser. An argon ion laser has a fundamental wavelength of at least about 514 nm, which can be frequency multiplied by the BBO crystal to have a divided wavelength of at least about 257 nm. The divided wavelength is equivalent to an energy level of about 4.8 eV, which is higher than the minimum electron emission energy level of activated CsBr of about 2 eV. The same argon ion laser cannot be used to generate electrons using un-activated CsBr, which in its untreated form has an energy gap of 7.8 eV that would require a laser source having a wavelength smaller than 158 nm, which is smaller than that being produced by the argon ion laser. For these reasons, activated electron-emitting material 24 comprising CsBr, emits electrons more reliably and with better yields than the un-activated material.

Figure 2:
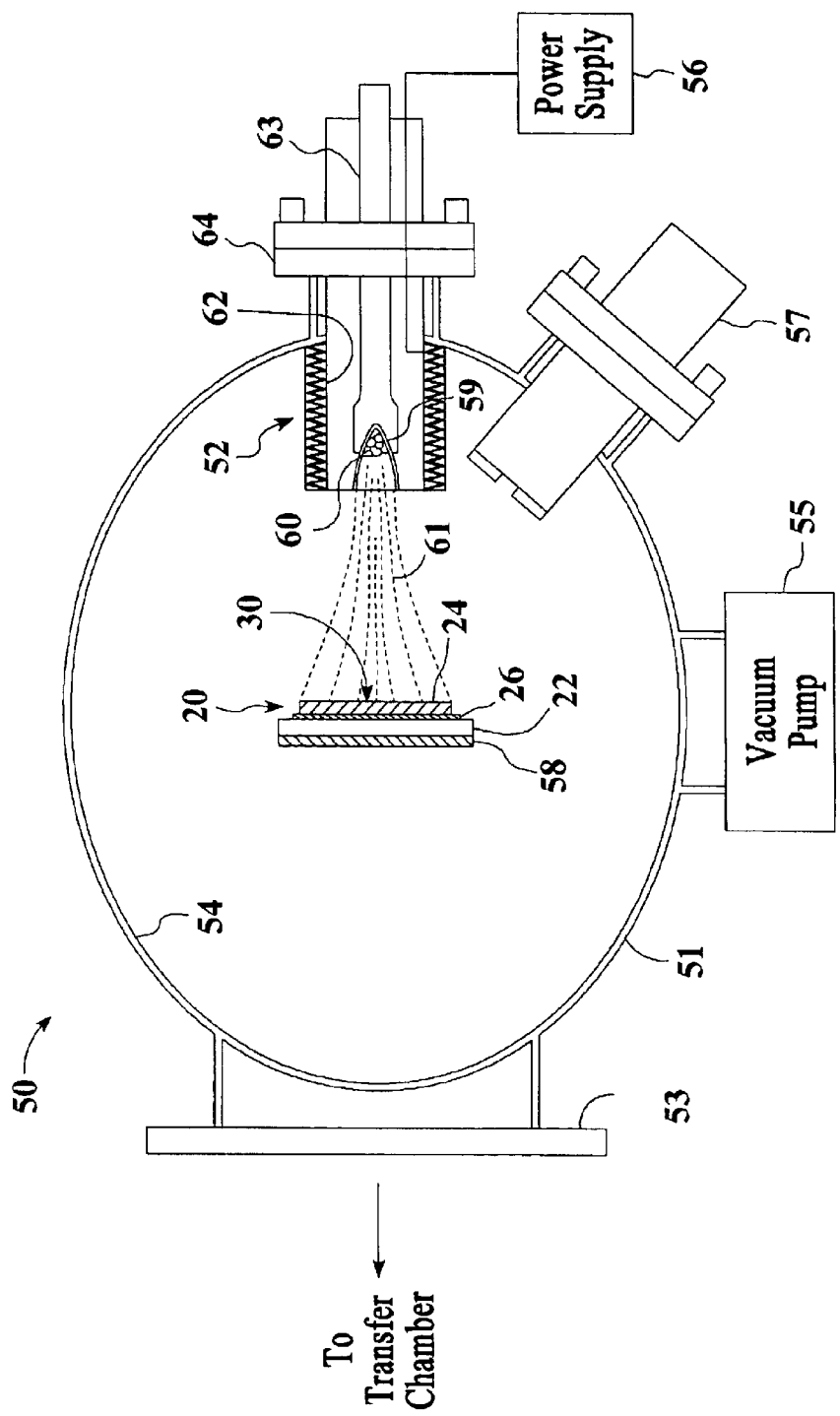
FIG. 2 is a schematic diagram of a photocathode deposition system capable of making the photocathode of FIG. 1.

The electron emitter layer of the photocathode 20 can be manufactured in a photocathode deposition system 50, an embodiment of which is illustrated in FIG. 2. The photocathode deposition system 50 comprises a sublimator chamber 51 to deposit both a conductor film 26 and an electron-emitting material 24 on a substratum 20. A transfer or analysis chamber (not shown) can also be used for post-deposition analysis of the photocathode 20. The substratum 22 is placed in the sublimator chamber 51, and effusion cells 52 are used to sublimate alkali halide material for deposition on the substratum 22. Channels 53 are provided between the chambers to allow transfer of the substratum 22 between the chambers without exposure to the external atmosphere.

The sublimator chamber 51 has stainless steel walls 54 and an ultra-high vacuum pump 55, such as an ion pump, to maintain an ultrahigh vacuum of from about $10^{-8}$ to about $10^{-11}$ Torr. Liquid nitrogen shrouding is used to provide cold surfaces within the sublimator chamber 51 to reduce unwanted contaminants. The substratum 22 is mounted on a holder 58, which is maintained at a selected temperature for film growth by a power supply 56. A temperature instrument (not shown) may also be provided. An optical pyrometer or thermocouple can be used to measure the temperature of the substratum 22.

An electron beam evaporator 57 is provided in the sublimator chamber 51 to evaporate material onto the substratum 22 to form the conductor film 26. The conductor film that transmits the photon beams 32 with sufficiently low attenuation to allow the beams to pass through and still irradiate the electron-emitting material with sufficient energy. The conductor film can be a molybdenum film having a thickness of less than about 10 nm to provide an attenuation of less than about 20% at 257 nm. The evaporator 57 operates by directing a beam of electrons onto a metal wire. The conductor film can also be made of other metals, such as Mo, Cr, Ta, that have low ultraviolet attenuation, good wetting, and strong adhesion.

The effusion cell 52 also has a crucible 59 for sublimating alkali halide material 60 placed therein. The crucible 59 is made of a high temperature material, such as ceramic, graphite, tantalum, molybdenum, or pyrolytic boron nitride. The crucible 59 is secured to a frame 63 connected to a flange 64 for attachment of the effusion cell 52 to the sublimator chamber 51. The sublimator chamber 51 is evacuated to form an ultra-high vacuum oxygen-free environment in which the effusion cell 52 can operate. A heating assembly 62 surrounding the crucible 59 heats the material 60 in the crucible 59 to control the sublimation of the source material 60 from solid to vapor form. For example, in one embodiment, the source material 60 is heated to a temperature of from about 60 to about 300°C. The evaporated molecules 61 generated by evaporation of the alkali halide material 60 in the crucible 59 deposits on the conductor film 26 to form an epitaxial film of alkali halide material.

After deposition of the halide material 60 on the substratum 22, the deposited material is activated to form an electron-emitting material 24 having a reduced minimum electron emission energy level at its surface. In one activation method, the deposited alkali halide material is irradiated with a radiation such as ultra-violet radiation having a wavelength <300 nm, such as deep-ultraviolet radiation having a wavelength in the range of from about 190 to about 532 nm. A suitable radiation source for an electron emitter layer comprising CsBr is, for example, an argon-ion laser. The activation is performed by directing the argon-ion laser beam onto the deposited electron-emitting material, in vacuum, for a time period of from about 120 to about 240 minutes. An example of the progress of the activation process is illustrated in FIG. 1. The activation can be performed insitu in an electron generating apparatus or the photocathode may be activated in a separate vacuum chamber and transferred to the operating chamber under vacuum. In the irradiation step, a lower minimum electron emission energy level is achieved by the migration of alkali metal atoms to form residual color centers and a surface-capping layer having a higher alkali metal atom concentration.

Figure 3:
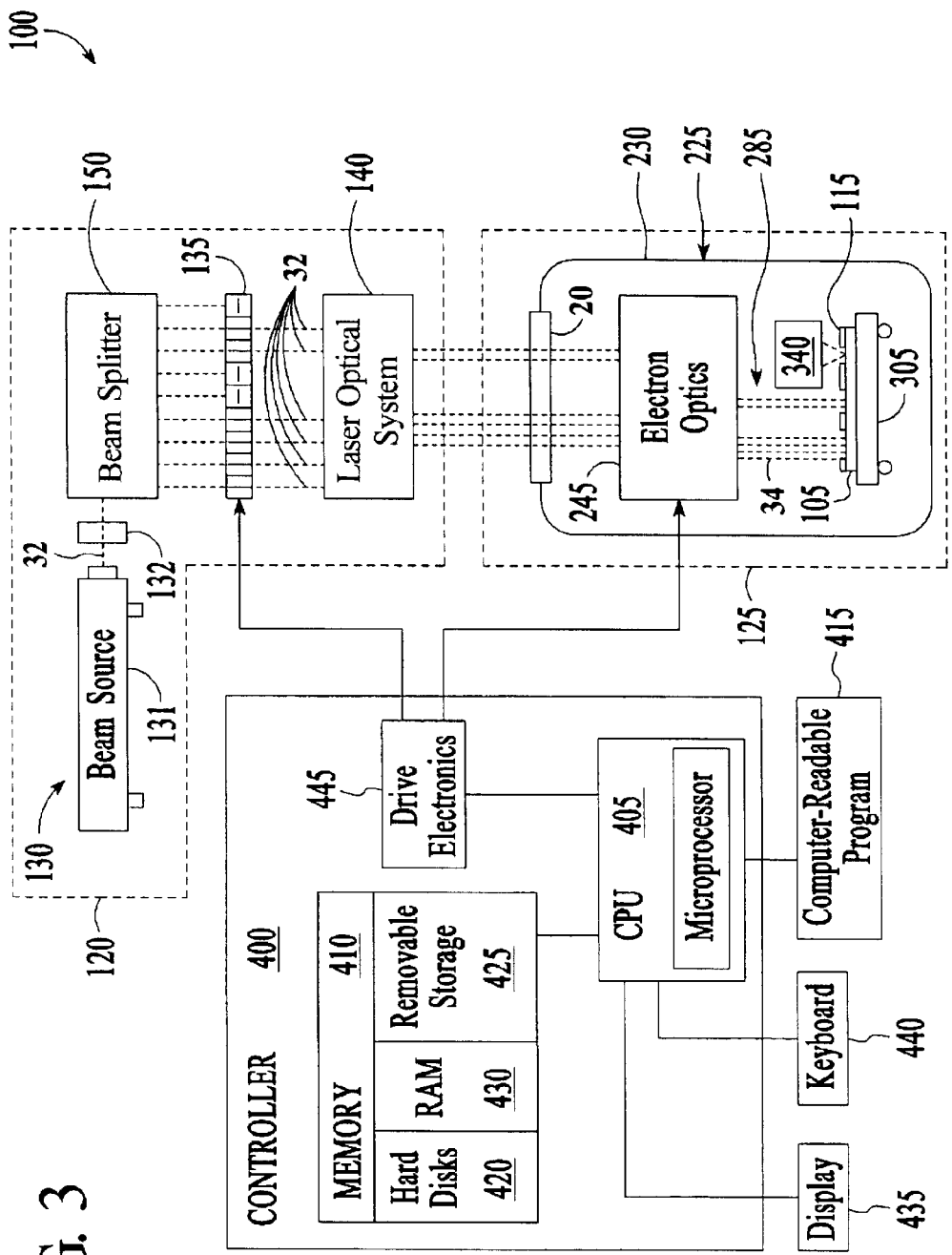
FIG. 3 is a schematic diagram of an embodiment of an electron beam apparatus having a beam source section, an electron beam section, and a controller.

An embodiment of an electron beam apparatus 100 having a photocathode with an activated electron-emitting material is illustrated in FIG. 3. The apparatus generates multiple electron beams 34 that are scanned across a workpiece 105. The workpiece 105 can be a blank mask; a silicon wafer; a compound semiconductor wafer; a printed circuit board (PCB); or a multichip module (MCM). In one embodiment, the electron beam pattern is imprinted in a mask comprising an electron-sensitive resist coating 115 on a workpiece 105 comprising glass or quartz, which is used in the fabrication of integrated circuits (IC). After exposing the workpiece mask to electron beams 34, the exposed resist layer 115 is developed to form a resist pattern on the mask. The embodiments of the apparatus 100 and workpiece 105 illustrated herein are examples, and should not be used to limit the scope of the invention, and the invention encompasses equivalent or alternative versions, as would be apparent to one of ordinary skill in the art.

Figure 4:
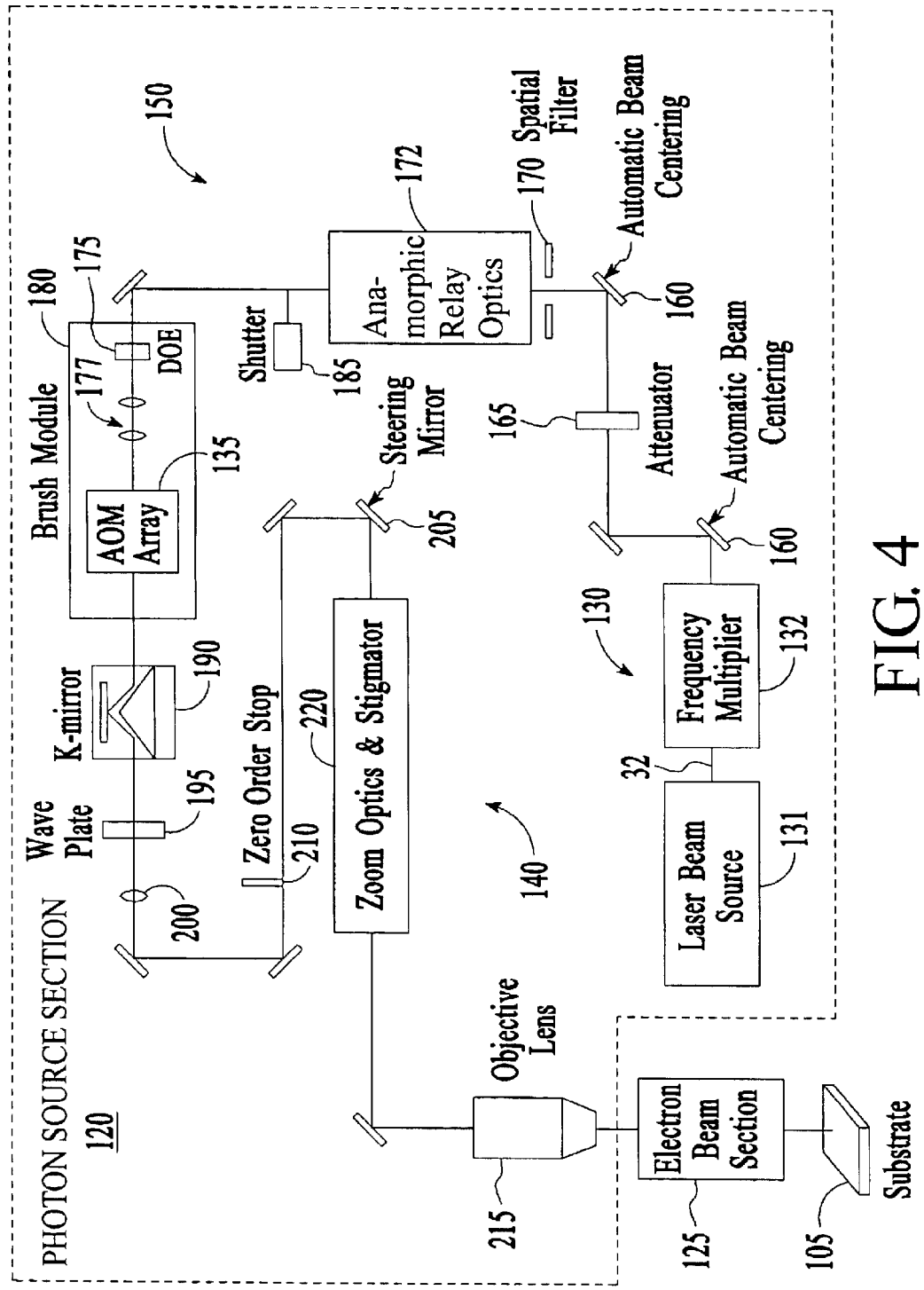
FIG. 4 is a schematic diagram of an embodiment of a laser beam section of an electron beam apparatus.

The electron beam apparatus 100 includes a photon source section 120 coupled to an electron beam section 125. The photon source section 120 may include a beam source 130, a beam modulator 135, optical system 140, and beam splitter 150, as illustrated in FIG. 4. In one version, the beam source 130 comprises a laser 131, such as an argon ion laser. The beam source 130 may also comprise a frequency multiplier 132 to increase the frequency of the laser beam 32 emitted by the laser 131. For example, the frequency multiplier 132 may comprise a beta barium borate (BBO) crystal that approximately doubles the frequency of the laser beam 32. For an argonion produced laser beam having a fundamental wavelength of about 514 nm, a BBO crystal can receive the laser beam and double its frequency; in other words, halve its wavelength to about 257 nm. Alternatively, the beam source 130 may also comprise a frequency doubled diode-pumped laser source. In one example, the diode-pumped laser source operates at a fundamental wavelength of about 532 nm. A laser having a wavelength of 364 nm can also be used. The beam source may also comprise a laser having a wavelength of from about 190 to about 532 nm.

In operation, a laser beam 32 is generated by the laser 131 is split by a beam splitter 150 into an array of spaced apart individual laser beams. The laser beam array is then directed to a beam modulator 135 that modulates the intensities of each of the laser beams 32. For example, the beam modulator 135 may comprise an array of acousto-optic modulators (AOM), which switch the laser beams 32 on or off by acoustically diffracting the laser beams in response to an RF signal, or set the transmitted photon flux of each individual beam to a predetermined intermediate value. In one embodiment, the laser beam 32 is split by a beam splitter 150 into an array comprising 32 individual beams, and a beam modulator 135 comprising a matching number of 32 AOM beam modulator elements is used to modulate the split beams. In an AOM array, the modulation of the photon intensity is achieved by applying RF power to the individual AOM channels. Applying different levels of RF power can be used for fine modulation of the light intensity. In another embodiment, the beam modulator 135 comprises a spatial light modulator (SLM) such as a micromechanical diffracting device. SLMs can be advantageous because they can modulate a larger number of laser beams, such as at least about 100 laser beams. A multiple gray level, multiple pass writing strategy may also be used, in beam modulation. Furthermore, another beam modulator (not shown) may be inserted in the optical system upstream of the beam splitter 150 to act as a fast auxiliary blanker. This additional beam modulator may be used during scan retrace when additional modulation is needed. In one illustrative embodiment, a 300 MHz carrier frequency is used to diffract the laser beams with an approximately 10 nsec pixel time.

The beam splitter 150 may include optical light lenses focused on a desired plane of the electron beam section 125. The laser beam 32 from the laser beam source 130 may also be actively controlled by automatic beam centering mirrors 160 so that alignment to the optical train, both in position and angle, is maintained. An attenuator 165, which may comprise a combination polarization-rotating element and polarizing beam splitter, adjusts the laser power to a range suitable for operation of the system while allowing the beam source 130 to operate in a power range optimized for reliability and stability. A spatial filter 170 can remove undesirable sections of the laser beams intensity profile. An anamorphic relay 172 can be provided to create a round beam exiting this aperture and relay it to the diffractive optical element (DOE) 175 inside a brush module 180. The DOE 175 is a grating that produces a plurality of laser beams 32. The laser beams 32 are focused by lenses of the brush module 180 to a region typically underneath the additional beam modulator. A mechanical shutter 185 before the brush module 180 is used to block radiation from reaching the electron beam section 125 when the electron beam apparatus 100 is not exposing the workpiece 105.

The individual modulated laser beams 32 are demagnified by the optical system 140. A K-mirror 190 allows for rotational adjustment of the linear array of laser beams 32 exiting the additional beam modulator. A wave plate 195 aligns the polarization of the beams for optimal focusing through birefringent substratums such as sapphire. A lens element 200 after the wave plate 195 focuses the laser beam array onto a focal spot on a steering mirror 205. Before reaching the steering mirror 205, the zero-order (undiffracted) light from the beam modulator 135 is blocked by a zero-order beam stop 210. The steering mirror 205 allows for small positional adjustment of the spot array at the final image plane of an objective lens 215. The zoom optics and stigmator 220 relay the focal spot into the pupil of the objective lens 215. Tilted plates inside the zoom optics and stigmator 220 provide adjustment capability to ensure that the focus of the spots onto the electron beam section 125 occurs in the same plane whether measured along the direction of the array of spots or perpendicular to it. Movable lenses within the zoom optics and stigmator 220 allow for slight magnification adjustment of the array of laser beams 32.

Figure 5:
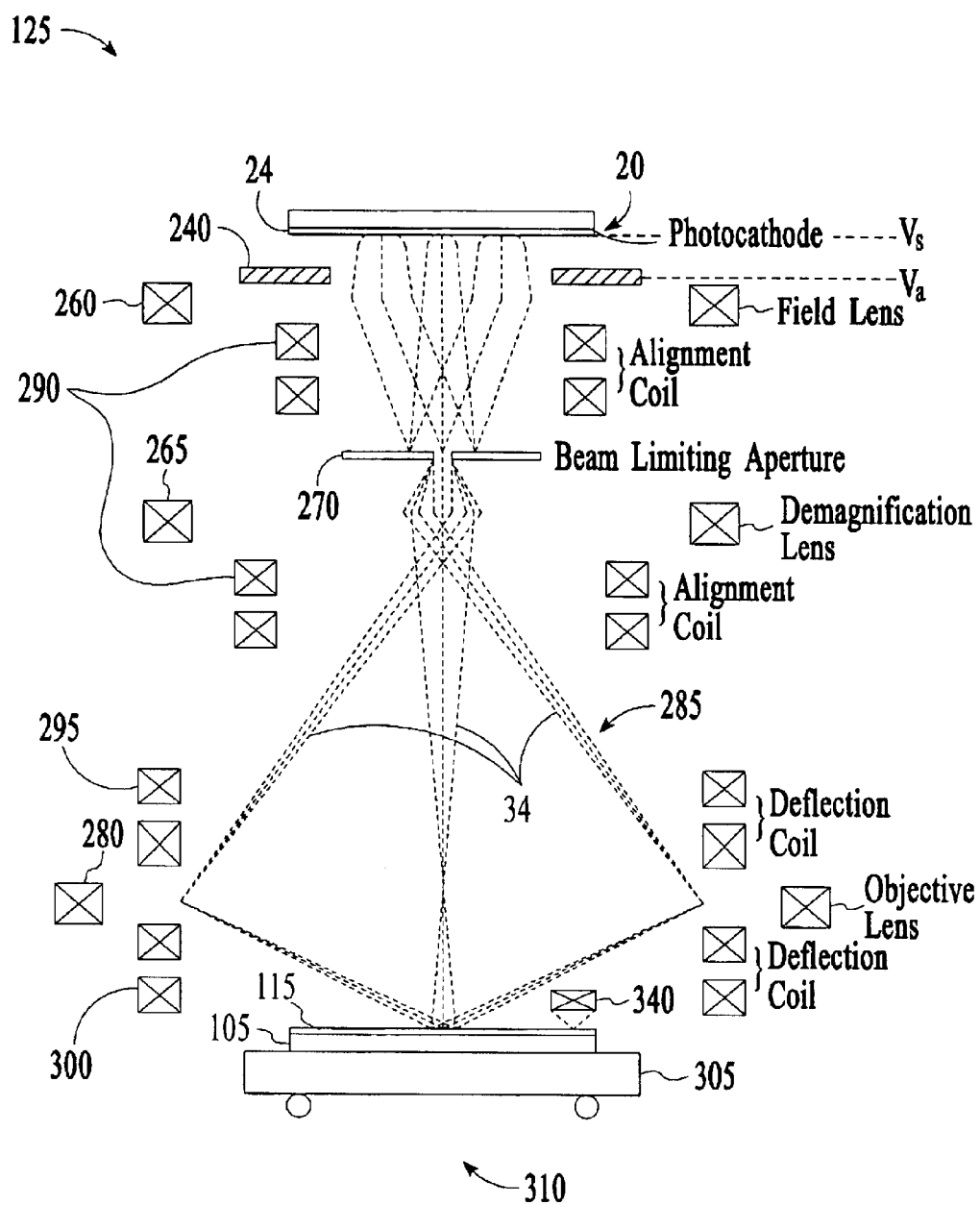
FIG. 5 is a sectional side view of an electron beam section of an electron beam apparatus.

Referring to FIGS. 3 and 5, below the photon source section 120, the electron beam section 125 converts the photon beam image generated by the photon source section 120 into a corresponding electron beam image. The electron beam section 125 may comprise a vacuum column 225 containing a vacuum environment in which electron beams 34 can be generated to expose the workpiece 105 to an electron beam image. The vacuum column 225 comprises walls 230 that are substantially vacuum-tight and are typically made of a material such as aluminum. One or more vacuum pumps (not shown) are provided to evacuate the vacuum column 225 to create and maintain the vacuum environment. In one embodiment, the vacuum pumps provide a first vacuum environment at the top portion of the vacuum column 225, and a second vacuum environment, which may have a different vacuum pressure at the bottom portion of the vacuum column 225. For example, the first vacuum environment may be at a gas pressure of about $10^9$ Torr and the second vacuum environment may be at a gas pressure of about $10^{-6}$ Torr. A pressure barrier may also be provided between the vacuum environments to maintain the pressure difference.

The electron beam section 125 includes a photocathode 20 according to the present invention, and electron beam elements such as an anode 240 and electron optics 245. During installation of the photocathode 20 in the electron beam apparatus 100, the photocathode 20 may be transferred within a continuous vacuum environment into the electron beam section 125. In operation, the optical system 140 focuses the array of laser beams 32 exiting the beam modulator 135 onto a photocathode 20. The photocathode 20 receives the laser beam image and generates corresponding multiple electron beams 34 that form an electron beam image.

The photocathode 20 forms an extraction field between itself and the anode 240 to draw the electron beams 34 from the photocathode 20 and accelerate the electron beams 34 toward the workpiece 105. For example, the extraction field may have a strength of from about 5 to about 10 kV/mm. The electrons are accelerated to an initial energy level to form defined electron beams 34. The energy level is selected to be sufficiently high to substantially prevent interactions between the electron beams 34. When the electron beams 34 are moving vertically at a higher velocity, lateral interactions between the electron beams 34 are typically less significant than when the electron beams 34 are moving at lower velocities. In one embodiment, the electron beams 34 are accelerated to energies of from 1 keV to, about 60 keV, such as about 50 keV. The electron beams 34 may have a brush width of from about 40 to about 90 microns, such as about 65 microns. Each electron beam 34 has a width of from about 270 to about 330 nm. When a voltage is applied to the anode 240, the electrons are accelerated and focused to form a multibeam virtual electron image of the photocathode emission surface corresponding to the laser beam image generated by the laser beam source 131. In one embodiment, the photocathode 20 is biased at about −50 kV, and is separated from a grounded anode 240 by an accelerating gap. The anode 240 is typically a planar electrode with an aperture in the center.

The electron optics 245 shape the electron beams 34 to focus, demagnify, stigmate, or align the electrons. Optionally, an electron field lens 260 near the photocathode 20 is used to reduce off-axis aberrations in demagnification lenses 265 that follow. A version of exemplary electron optics is described in commonly-assigned U.S, Pat. No. 6,215,128 by Mankos et al., entitled "Compact Photoemission Source, Field and Objective Lens Arrangement for High Throughput Electron Beam Lithography", filed on Mar. 18, 1999, which is hereby incorporated by reference in its entirety. The field lens 260 collimates the electrons exiting the accelerating region above the anode 240 and forms a crossover in the plane of a beam-limiting aperture 270. The virtual image created by the field lens 260 is then subsequently demagnified by the demagnification and objective magnetic lenses 265, 280 to form an array 285 of focused electron beams 34. Sets of alignment coils 290 are used to center and stigmate the electron beam array 285 in the beam-limiting aperture 270 and in the objective lens 280.

In one embodiment, a beam scanner 295 comprising a set of magnetic beam deflection coils is used to scan the array 285 of individually modulated electron beams 34 across the workpiece 105. Another set of magnetic deflection coils 300 performs dynamic stigmation and focus as the electron beam array 285 is scanned across a field of the workpiece 105. This allows dynamic stigmation, focus, or x/y deflection corrections to be applied to different parts of the scan field.

The electron beam pathway traversed by the electron beams 34 can be along a straight pathway, a curved pathway, or a series of redirected pathways. Thus, the apparatus components may be vertically oriented in a column above the workpiece 105, or oriented in an angled configuration (not shown), such as a right-angled configuration, or may be oriented in a curved configuration (also not shown).

The electron beam apparatus 100 further comprises a workpiece support capable of supporting the workpiece 105. The support 305 may comprise an electrostatic chuck (not shown) capable of holding the workpiece 105 against the support 305. The electron bean generator 100 may also comprise support motors capable of moving the support 305 to precisely position the workpiece 105 in relation to the electron optics 245 or to move the workpiece 105 to scan the electron beams 34 across the workpiece 105. For example, the support motors may comprise electric motors that translate the support 305 in the >x= and >y= directions along an x-y plane parallel to the workpiece surface, rotate the support 305, elevate or lower the support 305, or tilt the support 305. The electron beam apparatus 100 may further comprise support position sensors capable of precisely determining the position of the support 305. For example, the support position sensors may reflect a light beam (not shown) from the support 305 and detect the intensity of the reflected beam, where interferometric analysis indicates the distance between the workpiece support 305 and the support position sensors.

When generating a pattern in an electron-sensitive resist 115 of a workpiece 105, exposure throughput refers to the area of the pattern exposed on the workpiece 105 per unit time, and determines the speed of pattern generation. A first factor affecting throughput is the total current needed to generate the pattern. A certain fraction of the electron-sensitive resist 115 is to be exposed. To a first approximation, this exposure occurs after a particular electron dose, which can be calculated for a resist 115 of given sensitivity. The throughput is determined by the time required to deliver this dose, which is proportional to the maximum total electron current. This total current is proportional to the number of electron beams $N_b$ and the current $I_b$ delivered by each electron beam 34 of the array 285. Thus the time ô to expose a given area is ô $=AS/N_b I_b$, where A is the area to be patterned and S is the resist sensitivity (charge density required to expose the resist). High throughput can be achieved by using a sufficiently large number of electron beams 34 and a sufficiently large current in each electron beam 34.

The electron beam apparatus 100 further comprises a controller 400 comprising a suitable configuration of hardware and software to operate the components of the electron beam apparatus 100 to generate an electron beam pattern on the workpiece 105. An exemplary controller 400 is illustrated in FIG. 3. For example, the controller 400 may comprise a central processing unit (CPU) 405 that is connected to a memory 410 and other components. The CPU 405 comprises a microprocessor, such as a complex instruction set computer (CISC) microprocessor, for example a Pentium (TM) microprocessor commercially available from Intel Corporation, Santa Clara, Calif., or a reduced instruction set computer (RISC) microprocessor, capable of executing a computer-readable program 415. The memory 410 may comprise a computer-readable medium such as hard disks 420 in a redundant array of independent disks (RAID) configuration, removable storage 425 such as an optical compact disc (CD) or floppy disk, random access memory (RAM) 430, and/or other types of volatile or non-volatile memory. The interface between a human operator and the controller 400 can be, for example, via a display 435, such as a cathode ray tube (CRT) monitor, and an input device, such as a keyboard 440. The controller 400 may also include drive electronics 445 such as analog and digital input/output boards, linear motor driver boards, or stepper motor controller boards.

Figure 6:
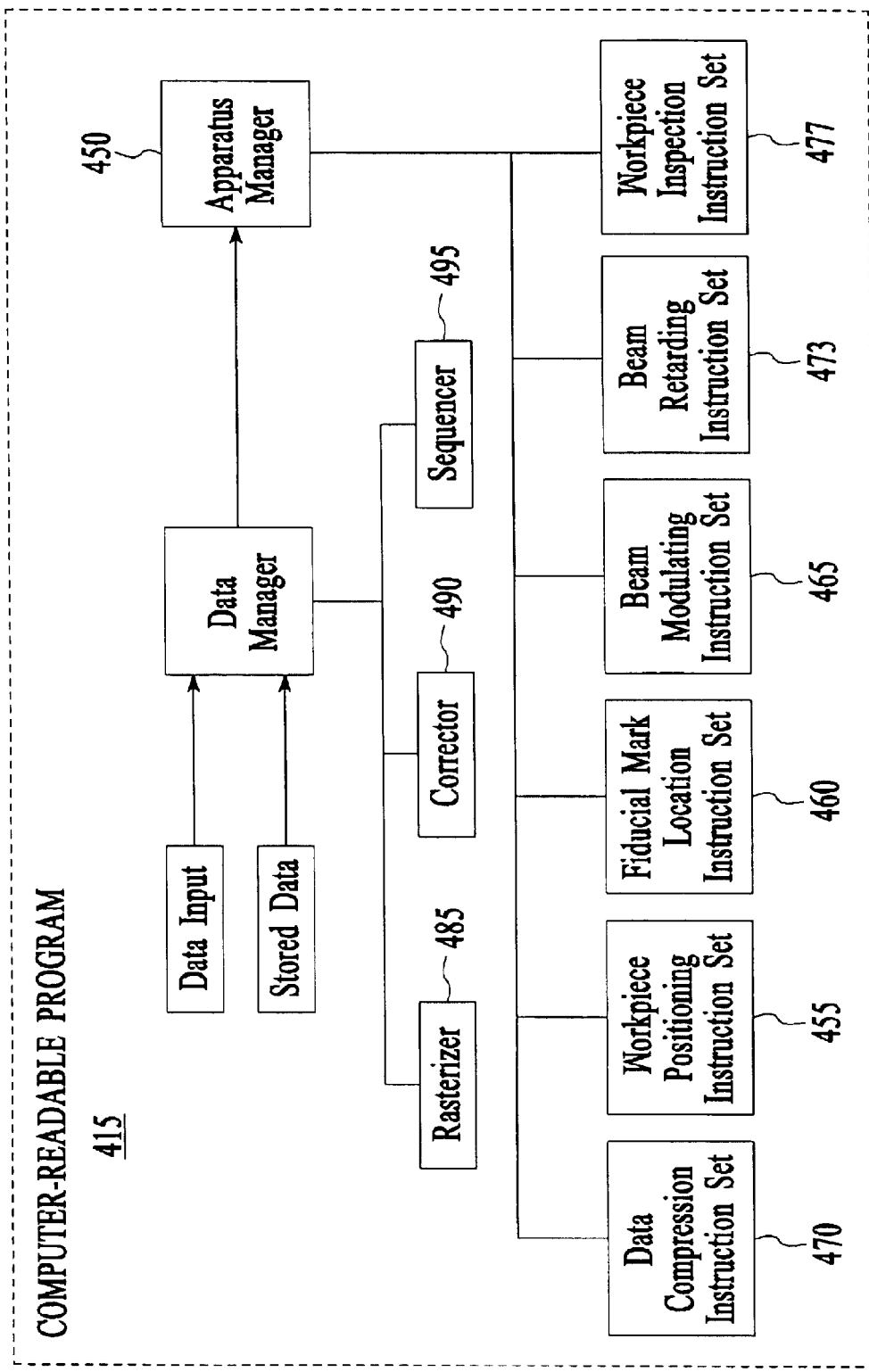
FIG. 6 is a schematic diagram of an embodiment of a computer-readable program executable by the controller shown in the apparatus of FIG. 3.

The computer-readable program 415 generally comprises software comprising sets of instructions to operate the apparatus components, and an apparatus manager 450 to manage the instruction sets, as illustrated in the exemplary version of FIG. 6. The computer-readable program 415 can be written in any conventional programming language, such as for example, assembly language, C, C++ or Pascal. Suitable program code is entered into a single file, or multiple files, using a conventional text editor and stored or embodied in the memory 410 of the controller 400. If the entered code text is in a high level language, the code is compiled, and the resultant compiler code is then linked with an object code of pre-compiled library routines. To execute the linked, compiled object code, the user invokes the feature code, causing the CPU 405 to read and execute the code to perform the tasks identified in the computer-readable program 415. Using a keyboard interface, a human user enters commands or registration parameters into the computer-readable program 415 in response to menus or screens displayed on the display 435. The computer-readable program 415 may include instruction sets to, for example, control the positioning of the workpiece support 305 (instruction set 455), locate fiducial marks on the workpiece 105 (instruction set 460), control beam modulation (instruction set 465), control data compression (instruction set 470), and control the retarding of the electron beams 34 (instruction set 473). If the electron beam apparatus 100 is used to inspect the workpiece 105, the computer-readable program 415 may further comprise an instruction set to evaluate a signal from the detectors 342 to generate a pattern representative of the structure of the workpiece 105 (instruction set 477). This workpiece inspection instruction set 477 may also comprise program code to determine a property of the workpiece 105, such as a defect or critical dimension, from the evaluated signals. The instruction sets may receive parameters, such as a data file corresponding to the support position, the fiducial mark locations, the electron beam pattern, properties of the workpiece 105, or instructions entered by the human operator.

The controller 400 is adapted to generate, send, and receive signals to operate the apparatus components to generate a pattern by directing electron beams 34 onto the workpiece 105. For example, the controller 400 may send signals to the beam modulator 135 to control modulation of the electron beams 34 to the desired intensity levels, such as in correspondence to electron beam pattern data to write a corresponding pattern on the workpiece 105. The beam modulator 135 may also be controlled to scale the electron beam pattern in the scanning direction by timing the beam pulses, and the support motors may also receive real-time instructions from the controller 400 to control the position of the workpiece 105 to scale, rotate, or offset the pattern generated by the electron beams 34. As another example, the controller 400 may also operate a fiducial mark locator 340 by receiving measured locations of fiducial marks on the workpiece 105 and comparing them to intended locations to determine the deviation of each fiducial mark, thereby calculating the position of the workpiece 105.

Figure 7:
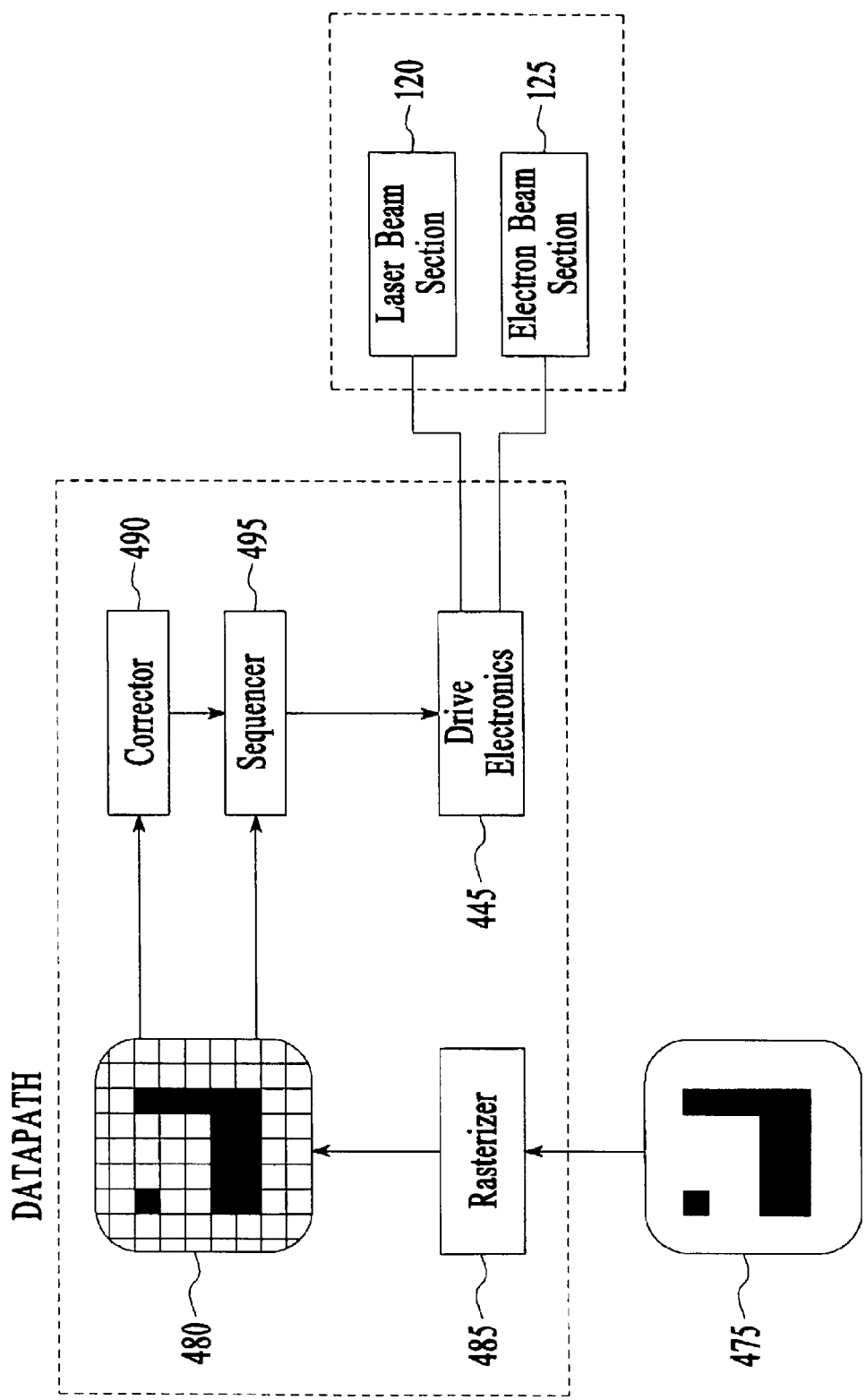
FIG. 7 is a block diagram of an embodiment of a data path for generating a raster scanning data pattern.

The controller 400 may control the beam modulator 135 and beam scanner 295 of the electron beam apparatus 100 to scan the electron beams 34 across the workpiece 105 according to a raster method, or alternatively according to a vector method. Depending on the scanning method used in generating a pattern on the workpiece 105, pattern data that are stored in the memory 410 and communicated to the beam modulator 135 are also different. FIG. 7 is a block diagram showing a data processing path for a raster scanned electron pattern. In a raster method, the pattern data 475 are processed into a bitmap 480 by a rasterizer 485 and the bitmap 480 is stored in the memory 410. An exemplary rasterizer 485 is described in commonly-assigned U.S. Pat. No. 5,533,170 by Teitzel et al., entitled "Rasterizer for a Pattern Generation Apparatus", filed on Nov. 22, 1994, which is hereby incorporated by reference in its entirety. Thereafter, a corrector 490 corrects the bitmap to compensate for proximity effects, heating effects, or other undesirable effects. A sequencer 495 then sequences the corrections to apply to the sequenced bitmap to modulate the electron beams 34. Control of pixel dosage is determined by the modulation of the electron beams 34 as a function of time. The electron beams 34 are scanned across the workpiece 105 in a substantially predetermined sequence of parallel scan lines to generate the pattern on the workpiece 105.

In a vector scanning method, in contrast, the pattern data are stored as vectors. For example, data corresponding to a line can be stored as a vector comprising a starting position, a length, and a direction. Additionally, certain other shapes may be stored in a way that refers to the characteristic dimensions of the shapes. The electron beams 34 are scanned across the workpiece 105 along paths that correspond to the pattern vectors. For example, to draw a line, the beam scanner 295 could deflect an electron beam 34 to the starting position in a first step, the beam modulator 135 turns on the electron beam 34 in a second step, the beam scanner 295 deflects the turned-on electron beam 34 through the length of the line in a third step, and the beam modulator 135 turns off the electron beam 34 in a fourth step.

Typically, the electron beams 34 are spatially distributed such that optical interference and other crosstalk between them are reduced or eliminated. However, typically a final exposed pattern in the resist layer 115 produced by raster scanning is composed of overlapping spots, which can be accomplished by employing an interlaced scan print strategy and writing with multiple passes. The controller 400 may contain pattern data in the memory 410 in either flat or hierarchical formats. The flat formats contain the pattern information in a raw form that is not organized by hierarchy or otherwise compressed. In contrast, the hierarchical formats contain the pattern information in a compressed hierarchical organization that expedites transmission from the memory 410 to the beam modulator 135.

Figure 9:
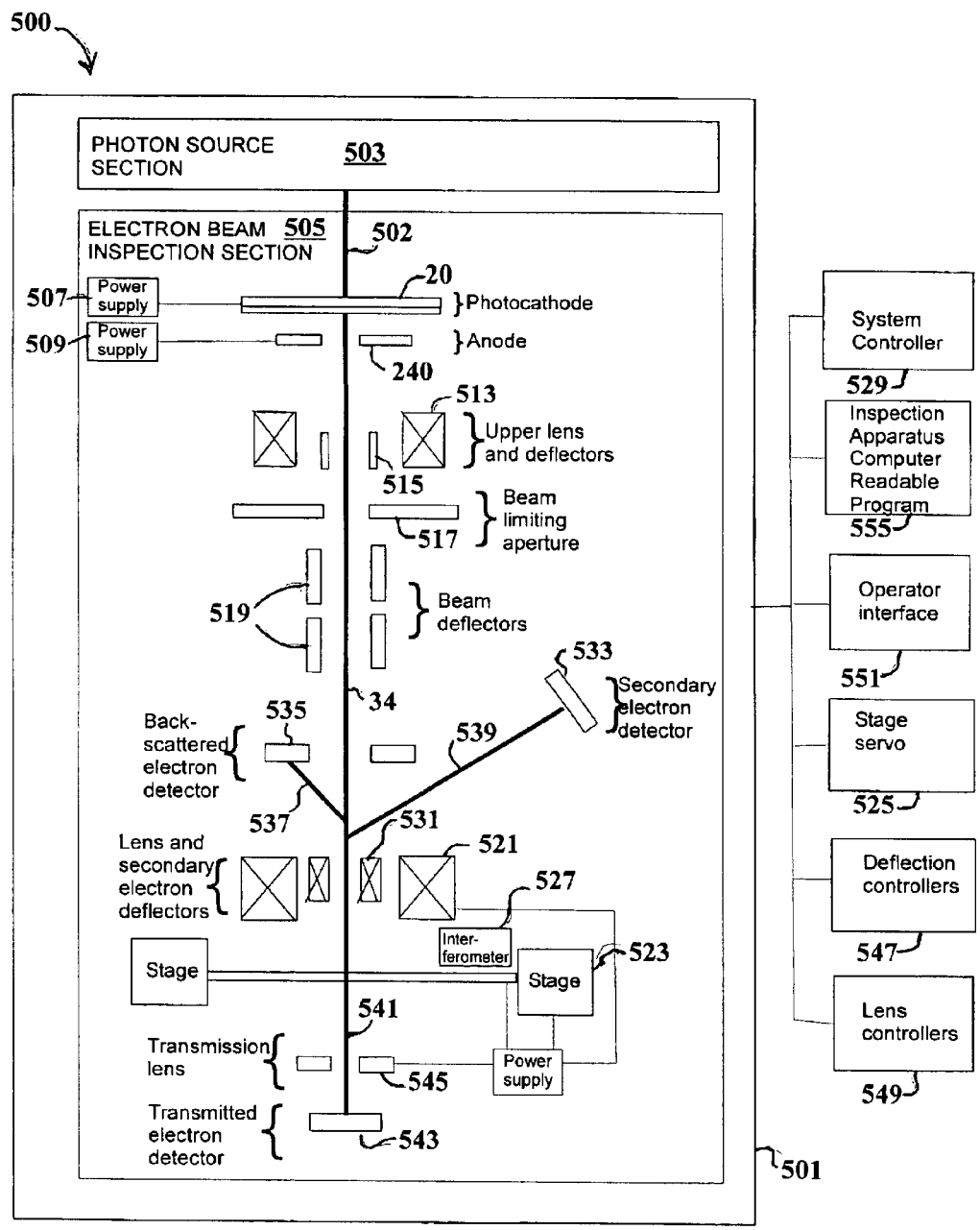
FIG. 9 is a schematic diagram of an embodiment of an electron beam inspection apparatus.

An exemplary embodiment of an electron beam inspection apparatus 500 is schematically illustrated in FIG. 9. The illustration is provided as an exemplary embodiment and should not be used to limit scope of the invention or this embodiment. Generally, the apparatus 500 directs electron beam 34 toward a substrate 105 and subsequently detects back-scattered electrons 537, secondary electrons 539, and transmitted electrons 541. The detected electrons can be used to generate an image representative of the substrate 105. For example, electron beams reflected from the substrate 105 can be used to determine a surface topography of the substrate 105, or electrons can be transmitted through the substrate 105 to determine an internal composition of the substrate 105 or to irradiate the substrate 105. Any electron generated image can be used to determine properties of the substrate 105, such as to accurately locate defects, measure dimensions of features of the substrate 105, or measure distances between two or more points on the substrate 105. For example, after manufacturing, a substrate 105 can be inspected to determine whether critical dimensions of features formed on the substrate are within a preselected tolerance range or are properly shaped. The electron beam inspection apparatus 500 is capable of inspecting semiconductor substrates, X-ray masks and other conductive substrates. The apparatus 500 can also be used in various modes of operation, for example, images from two sections of the same substrate 105 can be compared with each other, or the image from the substrate 105 can be compared with an image from a database that represents the design goal.

The electron beam inspection apparatus 500 comprises enclosing walls 501 to contain a vacuum environment generated by vacuum pumps (not shown). The apparatus 500 comprises a photon source section 503 and an electron beam inspection section 505. The photon source section 503 produces and delivers a single beam or multiple, independently-controllable radiation beams 502 to the electron beam inspection section 505. The section 503 may comprise the photon source section 120 from the apparatus 100 as previously discussed, or other photon sources, such as a lamp that produces photons with energies above at least about 3 eV.

Disposed below the photon source section 503 is the electron beam inspection section 505, comprising a photocathode 20 to receive the radiation beam 502 and generate an electron beam 34. The photocathode 20 comprises an activated alkali halide material that emits electrons when excited with radiation as described. Power supplies 507, 509 deliver bias conditions to the photocathode 20 and the anode 240 to form an extraction field between the photocathode 20 and the anode 240. For example, the extraction field may have a strength of from about 0.1 to 5 kV/mm. In one embodiment, the photocathode 20 is biased at about 1 kV. The anode 240 is typically a planar electrode with an aperture in the center.

The electron beam inspection section 505 also comprises electron optics to focus, control, deflect, and otherwise shape the electron beam 34 emitted by the photocathode 20, which is also referred to as the primary beam 34. An upper lens 513 may be disposed below the photocathode 20 and anode 240 to collimate the electron beam 34. An upper deflector 515 may also be optionally disposed near the upper lens 513 for alignment, stigmation, and blanking of the electron beam 34. The upper deflector 515 may be, for example, an electrostatic deflector. A beam limiting aperture 517 is disposed below the upper lens 513 and upper deflectors 515 to provide further beam shaping and comprises several holes. A pair of electrostatic beam deflectors 519 are disposed below the beam limiting aperture 517 to control the deflection of the beam 34 as it scans the substrate 105. The beam deflectors 519 may also be used to control the incident primary beam 34 such that interference with other electrons generated by the incidence of the primary beam 34 on the substrate 105 are minimized. A lens 521 is disposed below the beam deflectors 519 to refocus the electron beam 34.

The substrate 105 to be inspected is held and positioned by an x-y stage 523 disposed below the lens 521. The stage 523 is controlled by a stage servo 525. Interferometers 527 disposed about the stage 523 and substrate 105 are used for positioning and alignment of the substrate 105. Communication between the stage 523, stage servo 525, and the interferometers 527 is performed by a system controller 529.

The electron beam inspection apparatus 500 can detect one or more of secondary 539, back-scattered 537, and transmission electrons 541. To detect secondary electrons 539, the apparatus 500 comprises secondary electron deflectors 531 and a secondary electron detector 533. The secondary electron deflector 531 is disposed near the lens 521 and is capable of deflecting secondary electrons 539 to the secondary electron detector 533 based on their energy levels. In one version, the secondary electron deflector 531 comprises a Wien filter that only allows charged particles having a threshold energy to pass uninhibited and deflects the path of particles at other energies. The Wien filter is tuned to the incident primary electron beam energy to deflect the lower energy secondary electrons 539. The secondary electron detector 533 receives deflected secondary electrons 539, and may be a reverse biased high frequency Schottky barrier detector. Other types of semiconductor detectors may also be used. The stage 523, substrate 105, and portions of the lens 521 may be biased in such a way as to increase the energy levels of secondary electrons 539 to allow their efficient collection, and bias conditions are coordinated with the tuning of the Wien filter.

The back-scattered electron detector 535 is disposed annularly about, and above the lens 521, and comprises a hole in the center to allow passage of the primary electron beam 34. Back-scattered electrons 537 typically have a higher energy than secondary electrons 539, and may be further accelerated by bias conditions on the stage 523, substrate 105, and lens 521, to allow them to pass relatively uninhibited by the secondary electron deflector 531. The apparatus 500 may also be operated such that the secondary electron deflector 531 is turned off and thus only back-scattered electrons 537 will be detected. The back-scattered electron detector 535 may be a Schottkey barrier detector similar to other detectors, but with the above mentioned hole in the center.

To allow inspection of partially transparent substrates, a transmission electron detector 543 is located below the stage 523. A transmission lens 545 is disposed below the stage 523 and above the transmission electron detector 543. The transmission electrostatic lens 545 is used to spread the transmitted electron beam 541 to a diameter suitable for detection by the transmitted electron detector 543, which may also be a Schottky barrier detector.

Figure 10:
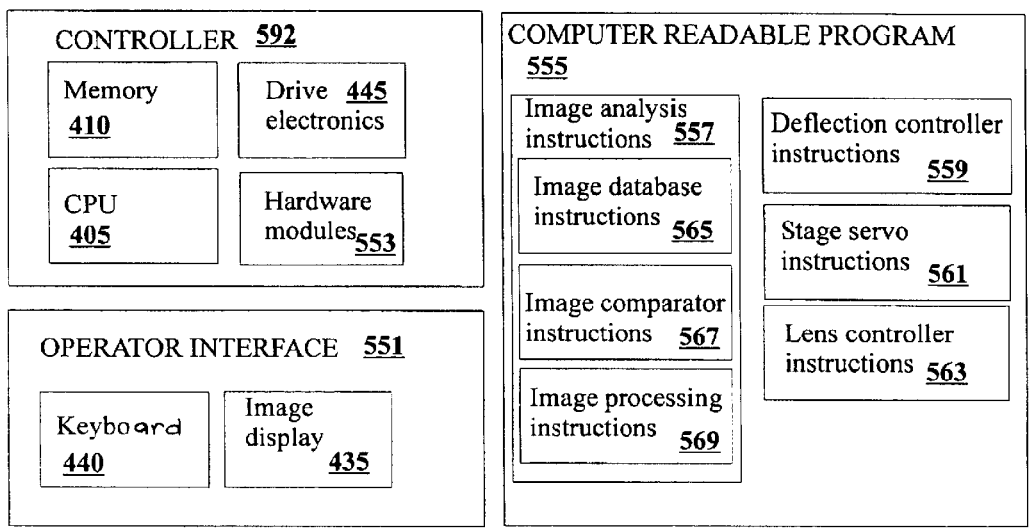
FIG. 10 is a schematic diagram of an embodiment of a computer-readable program to operate the electron beam apparatus.

The system controller 529 coordinates the operation of the apparatus 500 and its subsystems, which include deflector controllers 547, the stage servo 525, lens controllers 549, an inspection apparatus computer readable program 555, and an operator interface 551. The system controller 529, as illustrated in FIG. 10, comprises memory 410, CPU 405, drive electronics 445, and hardware modules 553. The memory 410 may further comprise hard disks, RAM, and removable storage (all of which are not shown). The drive electronics 445 function as the interface between the system controller 529 and the various other subsystems of the apparatus 500. The hardware modules 553 may comprise specialized hardware to facilitate the function of the system controller 529. The hardware modules 553 are removable and may be periodically exchanged for updated modules. The deflection controllers 547 control the operation of the various beam deflectors. The inspection apparatus computer readable program 555 includes instruction sets that the system controller 529 may use to operate the apparatus 500. The instruction sets comprise image analysis instructions 557, defection controller instructions 559, stage servo instructions 561, and lens controller instructions 563. The image analysis instructions 557 comprise image database instructions 565, image comparison instructions 567, image processing instructions 569. The image analysis instruction sets 557 include instructions for such purposes as storing image scan data, reading and retrieving image data from a database, comparing scanned image data with images from the image database or other scanned data, and high level image processing algorithms. The operator interface 551 comprises at least a keyboard 440 and a display 435 and relays information to a human operator and accepts commands. The interface 551 may also comprise other input and output devices such as a mouse, floppy disk drive, compact disc drive, and a printer (all not shown).

During operation of the apparatus, the substrate 105 to be inspected is placed beneath the electron beam 34 on the x-y stage 523. Alignment of the substrate 105 is achieved by scanning the substrate 105 with the electron beam 34 and observing the image on the display 435. The apparatus 500 then directs an electron beam 34 at the substrate 105 and detects secondary electrons 539 generated by the beam 34, the back-scattered electrons 537 from the beam 34 and transmitted electrons 541 which pass through the substrate 105. Data collection and analysis of the scan is performed by the system controller 529 and the inspection apparatus computer readable program 555. The position and movement of the stage 523 during the inspection of the substrate 105 is controlled by the stage servo 525, interferometers 527, and the system controller 529.

When comparing the substrate 105 to a database image, data from the scan is stored in the memory 410, and a comparison to the database image is performed by the system controller 529 using the image analysis instructions 557. Likewise, when comparing two sections of the same substrate 105, the stage servo 525 moves the stage 523 so that the electron beam 34 alternately scans each section or subsections. The scan data of the first section or subsection is stored in the memory 410, and then this data, along with the scan data of the second section or subsection is processed by the system controller 529 and the image analysis instructions 557. Various defect detection algorithms may be implemented via the image analysis instructions 557, which may interpret the comparison of the image data according to algorithms. After the substrate 105 has been inspected, a list of defects, together with their locations, is displayed on the display 435 and the operator can then initiate a defect review via the keyboard 440. In response to operator commands, the apparatus 500 may locate and provide scans of the neighborhood of each defect and displays the image to the operator on the display 435.

Two important applications of the electron beam inspection apparatus 500 are the detection of small physical defects and the detection of defects buried well beneath the surface of the substrate 105. Detection of small physical defects is becoming increasingly difficult. Shrinking feature sizes and increasing aspect ratios are pushing inspection of substrates beyond the inherent limits of optical inspection. The electron beam inspection device 500 can typically achieve higher resolution and higher depth of field than optical inspection devices, making electron beam inspection an increasingly important tool for the processing of substrates.

Defects buried well beneath the surface of the substrate 105 are also an important application and are essentially invisible to optical devices. Voids in contact and via plugs can often be hidden beneath several layers of subsequently deposited material. Incomplete etch or excess polymer buildup during the formation of holes for contacts and vias are also a concern. Buried defects can be discovered by electron beam inspection even if the electron beam inspection apparatus 500 can not form a direct image of the area of concern. Buried defects can be identified using a technique known as voltage contrast. Upon illumination by an electron beam 34, a defective hole charges up differently than a non-defective hole. The bad hole either glows more or less, depending on image conditions, than the good ones do in the electron beam image. A defective plug can also be found this way. Upon illumination by the electron beam 34, the higher resistance of the defective plug causes it to glow either more or less brightly in the image, thus identifying itself.

Although the present invention has been described in considerable detail with regard to certain preferred versions thereof, other versions are possible. The present invention could be used with other electron beam apparatuses 100 or other equivalent configurations as would be apparent to one of ordinary skill in the art. For example, the electron beam apparatus 100 may generate a pattern by generating and modulating the electron beams 34 directly rather than in the photon source section 120. Also, the electron beam apparatus 100 may generate the electron beams 34 by illuminating the photocathode 20 with other electron beams from an electron beam source rather than with the laser beams 32 from the photon source section 120. Thus, the appended claims should not be limited to the description of the preferred versions contained herein.

What is claimed is:

1. An electron beam apparatus comprising:

(a) a beam source to generate a radiation beam;

(b) a photocathode comprising an electron-emitting material composed of activated alkali halide having a minimum electron emission energy level that is less than 75% the minimum electron emission energy level of the un-activated alkali halide, whereby the electron-emitting material emits electrons when the radiation beam is incident thereon;

(c) electron beam elements to form an electron beam from the emitted electrons and direct the electron beam onto a workpiece; and (d) a support to support the workpiece.

2. An apparatus according to claim 1 wherein the electron-emitting material is composed of activated alkali halide having a minimum electron emission energy level that is less than 50% of the minimum electron emission energy level of the un-activated alkali halide.

3. An apparatus according to claim 1 wherein the activated alkali halide comprises a minimum electron emission energy level that is less than about 5 eV.

4. An apparatus according to claim 1 wherein the un-activated alkali halide absorbs a first level of a radiation capable of creating color centers to form the activated alkali halide, and the activated alkali halide absorbs a second level of the same radiation to emit electrons.

5. An apparatus according to claim 1 wherein the activated alkali halide comprises an interior region having a first alkali concentration, and a surface region having a second alkali concentration that is higher than the first alkali concentration.

6. An apparatus according to claim 5 wherein the second alkali concentration is higher than the first alkali concentration by at least a fraction of a monolayer of alkali atoms.

7. An apparatus according to claim 1 wherein the alkali halide comprises cesium halide.

8. An apparatus according to claim 7 wherein the cesium halide comprises cesium bromide or cesium iodide.

9. An apparatus according to claim 1 wherein the beam source comprises (i) a diode-pumped laser or argon-ion laser, and (ii) a frequency multiplier crystal.

10. An apparatus according to claim 1 wherein the beam source comprises a laser having a wavelength of from about 190 to about 532 nm.

11. An electron beam pattern generator to generate a pattern of electrons on a workpiece, the pattern generator comprising:

(a) a laser beam source to generate a laser beam having a wavelength of from about 190 to about 532 nm;

(b) a beam modulator to modulate the intensity of the laser beam according to a pattern and direct the modulated laser beam onto a photocathode;

(c) a photocathode comprising an electron-emitting material composed of activated alkali halide having a minimum electron emission energy that is less than about 5 eV, such that the electron-emitting material emits electrons when the modulated laser beam is incident thereon;

(d) electron beam elements to form an electron beam from the emitted electrons and direct the electron beam onto a workpiece; and (e) a support to support the workpiece.

12. An electron beam inspection apparatus to inspect a workpiece with electron beams, the apparatus comprising:

(a) a beam source to generate a laser beam having a wavelength of from about 190 to about 532 nm;

(b) a photocathode comprising an electron-emitting material composed of activated alkali halide having an electron emission minimum energy that is less than about 5 eV, such that the electron-emitting material emits electrons when the laser beam is incident thereon;

(c) electron beam elements to form an electron beam from the emitted electrons and direct the electron beam onto a workpiece;

(d) a support to support the workpiece; and (e) an electron detector to detect electrons backscattered from the workpiece to inspect the workpiece.

13. An electron generating method comprising:

(a) providing an electron-emitting material composed of alkali halide;

(b) activating the alkali halide to form an activated alkali halide having a minimum electron emission energy level that is less than 75% of the minimum electron emission energy level of the un-activated alkali halide; and (c) directing a radiation beam on the activated alkali halide, the radiation beam having photons with an energy level that is higher than the minimum electron emission energy level of the activated alkali halide to cause electrons to be emitted therefrom.

14. A method according to claim 13 wherein (b) comprises directing the radiation beam onto the alkali halide material for a sufficient time period that the alkali halide develops an interior region having a first alkali concentration and a surface region having a second alkali concentration.

15. A method according to claim 14 comprising directing the second radiation onto the alkali halide for from about 120 to about 240 minutes.

16. A method according to claim 13 wherein (c) comprises modulating the radiation beam according to a pattern to generate modulated electron beams.

17. A method according to claim 13 further comprising:

(d) detecting electrons backscattered from the workpiece to inspect the workpiece.

18. A method of manufacturing a photocathode for an electron beam apparatus, the method comprising:

(a) providing a substratum in a process zone;

(b) evacuating the process zone;

(c) evaporating an alkali halide in the process zone to deposit alkali halide on the workpiece; and (d) activating the deposited alkali halide to have a minimum electron emission energy level that is less than half the electron emission minimum electron emission energy level of the un-activated alkali halide by directing radiation onto the deposited alkali halide for a sufficient time period to develop an interior region having a first alkali concentration and a surface region having a second alkali concentration that is higher than the first alkali concentration.

19. A method according to claim 18 wherein the radiation comprises a laser beam having a wavelength of from about 190 to about 532 nm.

20. A method according to claim 18 wherein (c) comprises evaporating an alkali halide material comprising cesium bromide or cesium iodide.

21. An electron beam pattern generator according to claim 11 wherein the electron-emitting material is composed of activated alkali halide having a minimum electron emission energy level that is less than 50% of the minimum electron emission energy level of the un-activated alkali halide.

22. An electron beam pattern generator according to claim 11 wherein the activated alkali halide comprises an interior region having a first alkali concentration, and a surface region having a second alkali concentration that is higher than the first alkali concentration.

23. An electron beam pattern generator according to claim 11 wherein the alkali halide comprises cesium halide.

24. An electron beam pattern generator according to claim 23 wherein the cesium halide comprises cesium bromide or cesium iodide.

25. An electron beam pattern generator according to claim 11 wherein the laser beam source comprises (i) a diode-pumped laser or argon-ion laser, and (ii) a frequency multiplier crystal.

26. An electron beam inspection apparatus according to claim 12 wherein the electron-emitting material is composed of activated alkali halide having a minimum electron energy level that is less than 50% of the minimum electron emission energy level of the un-activated alkali halide.

27. An electron beam inspection apparatus according to claim 12 wherein the activated alkali halide comprises an interior region having a first alkali concentration, and a surface region having a second alkali concentration that is higher than the first alkali concentration.

28. An electron beam inspection apparatus according to claim 12 wherein the alkali halide comprises cesium halide.

29. An electron beam inspection apparatus according to claim 28 wherein the cesium halide comprises cesium bromide or cesium iodide.

30. An electron beam inpsection apparatus according to claim 12 wherein the laser beam source comprises (i) a diode-pumped laser or argon-ion laser, and (ii) a frequency multiplier crystal.

* * * * *